United States Patent
Mahdavifar et al.

(10) Patent No.: US 9,083,387 B2
(45) Date of Patent: Jul. 14, 2015

(54) COMMUNICATION SYSTEM WITH COMPOUND CODING MECHANISM AND METHOD OF OPERATION THEREOF

(71) Applicant: Samsung Electronics Co., Ltd., Gyeonggi-Do (KR)

(72) Inventors: Hessam Mahdavifar, San Diego, CA (US); Mostafa El-Khamy, San Diego, CA (US); Jungwon Lee, San Diego, CA (US); Inyup Kang, San Diego, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/108,981

(22) Filed: Dec. 17, 2013

(65) Prior Publication Data
US 2014/0169492 A1 Jun. 19, 2014

Related U.S. Application Data

(60) Provisional application No. 61/738,563, filed on Dec. 18, 2012.

(51) Int. Cl.
*H04B 7/02* (2006.01)
*H04L 1/02* (2006.01)
(Continued)

(52) U.S. Cl.
CPC ............ *H03M 13/353* (2013.01); *H03M 13/13* (2013.01); *H04L 1/0041* (2013.01); *H04L 1/0045* (2013.01); *H04L 1/0057* (2013.01)

(58) Field of Classification Search
CPC .. H03M 13/353; H03M 13/13; H04L 1/0041; H04L 1/0045; H04L 1/0057

USPC ......................................................... 375/267
See application file for complete search history.

(56) References Cited

U.S. PATENT DOCUMENTS 7,656,337 B2 2/2010 Redmayne et al.
2013/0111291 A1* 5/2013 Ma ................................ 714/752
(Continued)

OTHER PUBLICATIONS

E.Arikan, "Channel polarization: A method for constructing capacity-achieving codes for symmetric binary-input memoryless channels", IEEE Transactions on Information Theory, vol. 55, No. 7, pp. 3051-3073, Jul. 2009.
(Continued)

*Primary Examiner* — Erin File
(74) *Attorney, Agent, or Firm* — IP Investment Law Group

(57) ABSTRACT

A communication system includes: an antenna for receiving a receiver signal for communicating a transmitter signal corresponding to the receiver signal over transmission channels according to a polar coding scheme; a communication unit including: an arrangement module for generating a sequenced-signal based on the receiver signal according to a permutation mechanism; and a decoder module for determining a communication content based on the sequenced-signal for communicating the communication content intended by the transmitter signal with a device.
The communication system includes: a communication unit including an encoder module for determining a coded-message for representing a communication content according to a polar coding scheme, permutation module for generating a message-channel map for mapping the coded-message to transmission channels; and an antenna for transmitting a transmitter signal based on the coded-message according to the message-channel map for communicating the transmitter signal through the transmission channels with a device.

18 Claims, 6 Drawing Sheets

(51) Int. Cl.
*H03M 13/35* (2006.01)
*H04L 1/00* (2006.01)
*H03M 13/13* (2006.01)

(56) References Cited

U.S. PATENT DOCUMENTS

| | | | | |
|---|---|---|---|---|
| 2013/0117344 | A1* | 5/2013 | Gross et al. | 708/490 |
| 2013/0336372 | A1* | 12/2013 | Lee et al. | 375/219 |
| 2014/0019820 | A1* | 1/2014 | Vardy et al. | 714/752 |
| 2014/0072067 | A1* | 3/2014 | Yu et al. | 375/267 |

OTHER PUBLICATIONS

E. Arikan, and E. Telatar, "On the rate of channel polarization", preprint of Jul. 24, 2008.

S.B. Korada, "Polar Codes for Channel and Source Coding", Ph.D. dissertation, EPFL, Lausanne, Switzerland, May 2009.

S.B. Korada, E. Sasoglu, and R.I. Urbanke, "Polar codes: Characterization of exponent, bounds and constructions", Proc. IEEE Intern. Symp. Information Theory, pp. 1483-1487, Seould, Korea, Jun. 2009.

Emmanuel Abbe et al., "Polar Codes for the m-User Multiple Access Channel", IEEE Transactions on Information Theory, vol. 58, Issue: 8, Aug. 2012.

Dazu Huang et al., "Fast polarization construction on binary discretememoryless channels", 2010 IEEE International Conference on Progress in Informatics and Computing (PIC), vol. 1, Shanghai, pp. 460-464, Dec. 12, 2010.

Eran Hof et al., "Polar Coding for Reliable Communications over Parallel Channels", Information Theory Workshop (ITW), 2010 IEEE, Dublin, pp. 1-5, Aug. 30, 2010.

* cited by examiner

COMMUNICATION SYSTEM WITH COMPOUND CODING MECHANISM AND METHOD OF OPERATION THEREOF

CROSS-REFERENCE TO RELATED APPLICATION(S)

This application claims the benefit of U.S. Provisional Patent Application Ser. No. 61/738,563 filed Dec. 18, 2012, and the subject matter thereof is incorporated herein by reference thereto.

TECHNICAL FIELD

An embodiment of the present invention relates generally to a communication system, and more particularly to a system with compound coding mechanism.

BACKGROUND

Modern consumer and industrial electronics, especially devices such as cellular phones, navigations systems, portable digital assistants, and combination devices, are providing increasing levels of functionality to support modern life including mobile communication. Research and development in the existing technologies can take a myriad of different directions.

The increasing demand for information in modern life requires users to access information at any time, at increasing data rates. However, telecommunication signals used in mobile communication effectively experience various types of interferences from numerous sources, as well as computational complexities rising from numerous possible formats for communicated information, which affect the quality and speed of the accessible data.

Thus, a need still remains for a communication system with compound coding mechanism. In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention provides a communication system, including: an antenna configured to receive a receiver signal for communicating a transmitter signal corresponding to the receiver signal over transmission channels according to a polar coding scheme; a communication unit, coupled to the antenna including: an arrangement module configured to generate a sequenced-signal based on the receiver signal according to a permutation mechanism; and a decoder module, coupled to the arrangement module, configured to determine a communication content based on the sequenced-signal for communicating the communication content intended by the transmitter signal with a device.

A further embodiment of the present invention provides a communication system, including: a communication unit including: an encoder module configured to determine a coded-message for representing a communication content according to a polar coding scheme, a permutation module, coupled to the encoder module, configured to generate a message-channel map for mapping the coded-message to transmission channels; and an antenna, coupled to the communication unit, configured to transmit a transmitter signal based on the coded-message according to the message-channel map for communicating the transmitter signal through the transmission channels with a device.

An embodiment of the present invention provides a method of operation of a communication system including: receiving a receiver signal with an antenna for communicating a transmitter signal corresponding to the receiver signal over transmission channels according to a polar coding scheme; generating a sequenced-signal based on the receiver signal according to a permutation mechanism with a communication unit; and determining a communication content based on the sequenced-signal for communicating the communication content intended by the transmitter signal with a device.

A further embodiment of the present invention provides a method of operation of a communication system including: determining a coded-message with a communication unit for representing a communication content according to a polar coding scheme; generating a message-channel map for mapping the coded-message to transmission channels; and transmitting a transmitter signal with an antenna based on the coded-message according to the message-channel map for communicating the transmitter signal through the transmission channels with a device.

Certain embodiments of the invention have other steps or elements in addition to or in place of those mentioned above. The steps or elements will become apparent to those skilled in the art from a reading of the following detailed description when taken with reference to the accompanying drawings.

DETAILED DESCRIPTION

Figure 1:
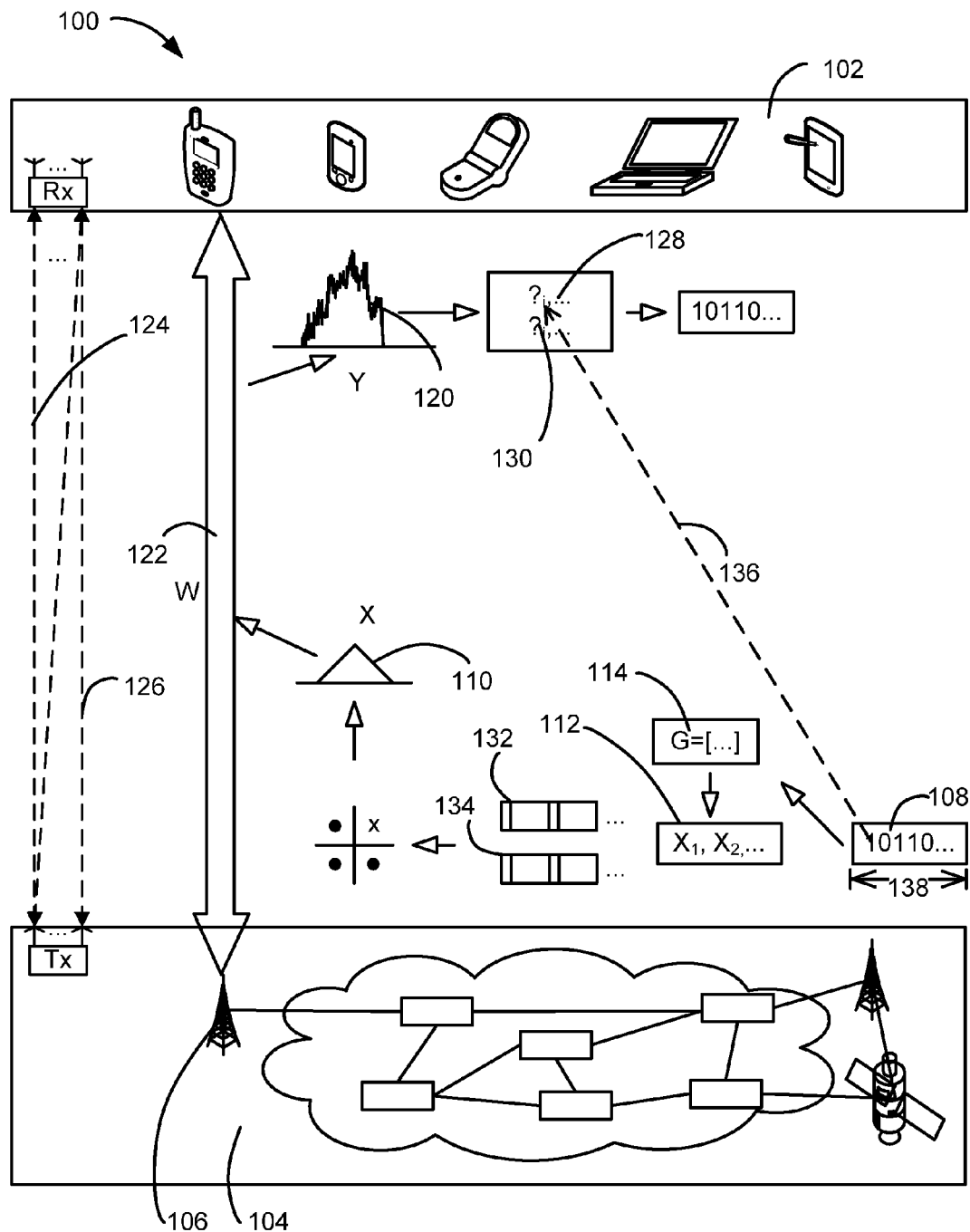
FIG. 1 is a communication system with compound coding mechanism in an embodiment of the present invention.

The following embodiments of the present invention can be used to communicate a communication content using a device according to a polar coding scheme over multiple instances of a transmission channel. The communication can utilize compound polar channel. The communication content can be processed using an initial building block, a transformation mechanism, a generator matrix, a permutation mechanism, or a combination thereof for the communication.

An embodiment of the present invention can include the initial building block and the transformation mechanism providing transmission of polar code over the transmission channel including compound channels and providing unified compound polar scheme for transmission over compound channels along with the capacity-achieving property for the compound channel. The generator matrix provides increased throughput by enabling achievement of capacity. The permutation mechanism further provides transmission of polar code over the transmission channel including compound channels and decreased complexity in encoding and decoding signals using polar codes over compound channels.

The following embodiments are described in sufficient detail to enable those skilled in the art to make and use the invention. It is to be understood that other embodiments would be evident based on the present disclosure, and that system, process, or mechanical changes may be made without departing from the scope of an embodiment of the present invention.

In the following description, numerous specific details are given to provide a thorough understanding of the invention. However, it will be apparent that the invention may be practiced without these specific details. In order to avoid obscuring an embodiment of the present invention, some well-known circuits, system configurations, and process steps are not disclosed in detail.

The drawings showing embodiments of the system are semi-diagrammatic, and not to scale and, particularly, some of the dimensions are for the clarity of presentation and are shown exaggerated in the drawing figures. Similarly, although the views in the drawings for ease of description generally show similar orientations, this depiction in the figures is arbitrary for the most part. Generally, the invention can be operated in any orientation. The embodiments have been numbered first embodiment, second embodiment, etc. as a matter of descriptive convenience and are not intended to have any other significance or provide limitations for an embodiment of the present invention.

The term "module" referred to herein can include or be implemented as software, hardware, or a combination thereof in the present invention in accordance with the context in which the term is used. For example, the software can be machine code, firmware, embedded code, and application software. The software can also include a function, a call to a function, a code block, or a combination thereof. Also for example, the hardware can be gates, circuitry, processor, computer, integrated circuit, integrated circuit cores, a pressure sensor, an inertial sensor, a microelectromechanical system (MEMS), passive devices, physical non-transitory memory medium having instructions for performing the software function, a portion therein, or a combination thereof.

The term "processing" as used herein includes filtering signals, decoding symbols, assembling data structures, transferring data structures, manipulating data structures, and reading and writing data structures. Data structures are defined to be information arranged as symbols, packets, blocks, files, input data, system generated data, such as calculated or generated data, and program data.

Referring now to FIG. 1, therein is shown a communication system 100 with compound coding mechanism in an embodiment of the present invention. The communication system 100 includes a first device 102, such as a mobile device including a cellular phone or a notebook computer, connected to a network 104. The network 104 is a system of wired or wireless communication devices or means that are connected to each other for enabling communication between devices.

For example, the network 104 can include a combination of wires, transmitters, receivers, antennas, towers, stations, repeaters, telephone network, servers, or client devices for a wireless cellular network. The network 104 can also include a combination of routers, cables, computers, servers, and client devices for various sized area networks.

The communication system 100 can include a second device 106 for directly or indirectly linking and communicating with the first device 102. The network 104 can include the second device 106. The second device 106 can receive wireless signals from the first device 102, transmit signals to the first device 102, process signals, or a combination thereof. The second device 106 can also relay signals between other base stations, components within the network 104, or a combination thereof.

The first device 102 can be connected to the network 104 through the second device 106. For example, the second device 106 can be a base station, can be included or with a cell tower, a wireless router, an antenna, a processing device, or a combination thereof being used to send signals to or receive signals from the first device 102, such as a smart phone or a laptop computer.

The first device 102 can connect to and communicate with other devices, such as other mobile devices, servers, computers, telephones, or a combination thereof. For example, the first device 102 can communicate with other devices by transmitting signals, receiving signals, processing signals, or a combination thereof and displaying a content of the signals, audibly recreating sounds according to the content of the signals, processing according to the content, such as storing an application or updating an operating system, or a combination thereof.

The second device 106 can be used to wirelessly exchange signals for communication, including voice signals of a telephone call or data representing a webpage and interactions therewith. The second device 106 can also transmit reference signals, training signals, error detection signals, error correction signals, header information, transmission format, protocol information, or a combination thereof.

Based on the communication method, such as code division multiple access (CDMA), orthogonal frequency-division multiple access (OFDMA), Third Generation Partnership Project (3GPP), Long Term Evolution (LTE), or fourth generation (4G) standards, the communication signals can include a reference portion, a header portion, a format portion, an error correction or detection portion, or a combination thereof imbedded in the communicated information. The reference portion, header portion, format portion, error correction or detection portion, or a combination thereof can include a predetermined bit, pulse, wave, symbol, or a combination thereof. The various portions can be embedded within the communicated signals at regular time intervals, frequency, code, or a combination thereof.

The second device 106 can communicate a communication content 108 by sending a transmitter signal 110 to the first device 102. The communication content 108 is data from a transmitting device intended for communication by reproduction or processing at a receiving device. For example, the communication content 108 can be a sequence of bits intended for displaying, audibly recreating, executing instructions, storing, or a combination thereof at a receiving device, such as the first device 102.

The second device 106 can modify the communication content 108 to generate and transmit the transmitter signal 110. The transmitter signal 110 is information actually transmitted by a device for communication and having a format for transmission. The second device 106 can generate the transmitter signal 110 by modifying the communication content 108 according to methods or standardizations predetermined by the communication system 100 to generate a coded-message 112. The coded-message 112 is a unit of information having a length predetermined by the communication system 100 for communicating information between devices.

For example, the second device 106 can generate the coded-message 112 including a polar coded message from the communication content 108 using a polar coding scheme 114. The polar coding scheme 114 is a method, a process, or a combination thereof for providing linear block error correcting code. The polar coding scheme 114 can include a set of codes, an alphabet, a rule set, or a combination thereof corresponding to one or a combination bit values.

Also for example, the second device 106 can generate the coded-message 112 from the communication content 108 by interleaving bits, adding formatting information, adding parity or self-correcting information, or a combination thereof. As a more specific example, the second device 106 can use a turbo-coding mechanism to generate the coded-message 112.

The communication system 100 can further generate the transmitter signal 110 from the coded-message 112. For example, the communication system 100 can generate the transmitter signal 110 as a combination or a sequence of symbols according to a modulation scheme such as quadrature amplitude modulation (QAM) or phase-shift keying (PSK). Also for example, the communication system 100 can represent the transmitter signal 110 as a sequence of bits transmitted according to the coded-message 112 or a sequence thereof. The transmitter signal 110 can be represented as 'X'.

The transmitter signal 110 can include the coded-message 112 according to a transmission block. The transmission block is a grouping of the coded-message 112 for transmitting between devices. For example, the transmission block can be limitation on a quantity of the coded-message 112, a duration for transmission, a format for arrange information, or a combination thereof. The transmitter signal 110 can include one or more instances of the transmission block grouping the coded-message 112 for representing the communication content 108.

The transmitter signal 110 can arrive at the first device 102 as a receiver signal 120 after traversing a transmission channel 122. The transmission channel 122 can be wireless, wired, or a combination thereof. The transmission channel 122 can be a direct link between the first device 102 and the second device 106 or can include repeaters, amplifiers, or a combination thereof. For example, the transmission channel 122 can include communication frequency, time slot, packet designation, transmission rate, channel code, or a combination thereof used for transmitting signals between the first device 102 and the second device 106. The transmission channel 122 can be represented as 'W'.

The mobile station 102 can receive the receiver signal 120. The receiver signal 120 is information received by a device in the communication system 100. The receiver signal 120 can include the transmitter signal 110 that has been altered from traversing the transmission channel 122. The receiver signal 120 can further include noise from the first device 102, the second device 106, or a combination thereof, interference signals from other devices and corresponding channel effects, or a combination thereof. The receiver signal 120 can be represented as 'Y'.

The communication system 100 can calculate estimate the transmission channel 122 from the receiver signal 120. The transmission channel 122 can be represented as an estimated description of changes to signals caused while traversing between devices.

The channel estimate can describe and quantize reflection, loss, delay, refraction, obstructions, or a combination thereof a signal can experience while traversing between the second device 106 and the first device 102. The channel estimate can be a matrix value characterizing the transmission channel 122. The channel estimate of the transmission channel 122 can be represented as '$\tilde{W}$'. The channel estimate can be a logarithmic-likelihood ratio (LLR) value.

The communication system 100 can determine or estimate the communication content 108 from the receiver signal 120. The communication system 100 can determine or estimate the communication content 108 based on the estimate of the transmission channel 122.

The communication system 100 can communicate the communication content 108 in a variety of ways. For example, the communication system 100 can communicate over the transmission channel 110 including a binary input discrete memory-less channel (B-DMC). Also for example, the communication system 100 can use a bit-interleaved coded modulation (BICM) mechanism for communicating between devices.

For further example, the communication system 100 can communicate using the transmission channel 110 including compound channels or multiple channels. As a more specific example, the second device 106 can transmit the transmitter signal 110 over a channel 124 and a further channel 126. The channel 124 and the further channel 126 each are separate instances of the transmission channel 122. The channel 124 and the further channel 126 can be independent of each other. For example, the channel 124 and the further channel 126 can include different instances of lines of sight, coding scheme, carrier frequency, time slot, communication code, communication path or set of connected wires, different transmitter and receiver antenna pairing, or a combination thereof.

Continuing with the example, the first device 102 can receive the receiver signal 120 including a receiver information 128 and a further receiver information 130. The receiver information 128 is information received through the channel 124. The further receiver information 130 is information received through the further channel 126. The channel 124 can be represented as '$W_1$' and the further channel 126 can be represented as '$W_2$'.

Continuing with the example, the receiver information 128 and the further receiver information 130 can be received by the same device or by different devices. The receiver signal 120 can include the receiver information 128, the further receiver information 130, other additional signals, or a combination thereof. The receiver information 128 and the further receiver information 130 can correspond to same instance or different instances of the transmitter signal 110. The receiver information 128 can be represented as '$Y_1$' and the further receiver information 130 can be represented as '$Y_2$'.

Continuing with the example, the second device 106 can transmit the transmitter signal 110 including a transmitter information 132 and a further transmitter information 134. The transmitter information 132 is a portion of the communication content 108 corresponding to the receiver information 128, the channel 124, or a combination thereof. The further transmitter information 134 is a portion of the communication content 108 corresponding to the further receiver information 130, the further channel 126, or a combination thereof. The transmitter information 132 can be represented as '$u_1$' and the further transmitter information 134 can be represented as '$u_2$'.

The communication system 100 can process for a bit channel 136. The bit channel 136 is a representation of influences and processes between an intended bit and a detected result. The bit channel 136 can be based on a bit or the symbol grouping multiple instances of bits for transmission, each symbol experiencing different effects of the transmission channel 122, processing each bit or each of the grouped bits in the detected symbol differently, or a combination thereof.

The bit channel 136 can represent the influences and the processes between a bit in the communication content 108 associated with a transmitting device and a corresponding value in a decoding result representing an estimation of the communication content 108 associated with a receiving device, such as resulting from processing the receiver signal 120. The bit channel 136 can be specifically associated with, such as resulting from a usage of, the polar coding scheme 114.

The communication system 100 can use the transmission channel 122 including B-DMC, the BICM, the polar coding scheme 114, or a combination thereof to communicate the communication content 108. Continuing with the example, the polar coding scheme 114 can include a channel polarization parameter. The channel polarization parameter can be represented as:

$$G = \begin{bmatrix} 1 & 0 \\ 1 & 1 \end{bmatrix}.$$ Equation (1)

The communication system 100 can apply a Kronecker power to the channel polarization parameter to calculate the n-th Kronecker power. The n-th Kronecker power can be represented as:

$$G^{\otimes(n+1)} = \begin{bmatrix} G^{\otimes n} & 0 \\ G^{\otimes n} & G^{\otimes n} \end{bmatrix}.$$ Equation (2)

Continuing with the example, the communication content 108, including the transmitter information 132 and the further transmitter information 134, can include information having a content block size 138 of $N=2^n$. The content block size 138 can represent a size or a quantity of the communication content 108, the transmitter signal 110, the coded-message 112, a derivation thereof, or a combination thereof.

Continuing with the example, the communication content 108 can include uniform, independent, and identically distributed information bits $V_1^N = (V_1, V_2, \ldots, V_N)$. The communication system 100 can multiply the communication content 108 with the n-th Kronecker power of the channel polarization parameter, such as by multiplying $V_1^N$ by $G^{\otimes n}$, to get the transmitter signal 110, such as $VX_1^N$, or a product thereof.

Continuing with the example, the transmitter signal 110 can be transmitted through N independent copies of the transmission channel 122, including the channel 124 and the further channel 126. The polar transformation process and mutuality of the information between the input, including the communication content 108 or a derivation thereof, and the output, including the receiver signal 120 or a derivation thereof, can be represented as:

$$I(V_1^N; Y_1^N) = \Sigma_{i=1}^N I(V_i; Y_1^N | V_1^{i-1}) = \Sigma_{i=1}^N I(V_i; Y_1^N, V_1^{i-1}).$$ Equation (3).

The term '$I(V_i; Y_1^N, V_1^N)$' can represent the transmission channel 122 seen by the bit $V_i$ based on a decoder used to decode the receiver signal 120. The generator matrix of this code for length $N=2^n$ can be a portion of $G^{\otimes n}$, such as for rows of $G^{\otimes n}$ corresponding to the good instances of the bit channel 136.

For illustrative purposes, the communication system 100 is described as the second device 106 transmitting information and the first device 102 receiving the transmitted information. However, it is understood that the communication system 100 can have the second device 106 as the receiving device and the first device 102 as the transmitting device.

Also for illustrative purposes, the communication system 100 will be described as having two instances or portions of independent channels for the transmission channel 122. However, it is understood that the transmission channel 122 can include 3 or more instances. The communication system 100 can utilize a set of 'l' binary-input channels. Each binary sequence of length l can be transmitted through the transmission channel 122 with each bit transmitted over one of the l channels. For any N which is a multiple of l, a sequence of N bits can be transmitted over the transmission channel 122 in such a way that each channel carries N/l bits.

Figure 2:
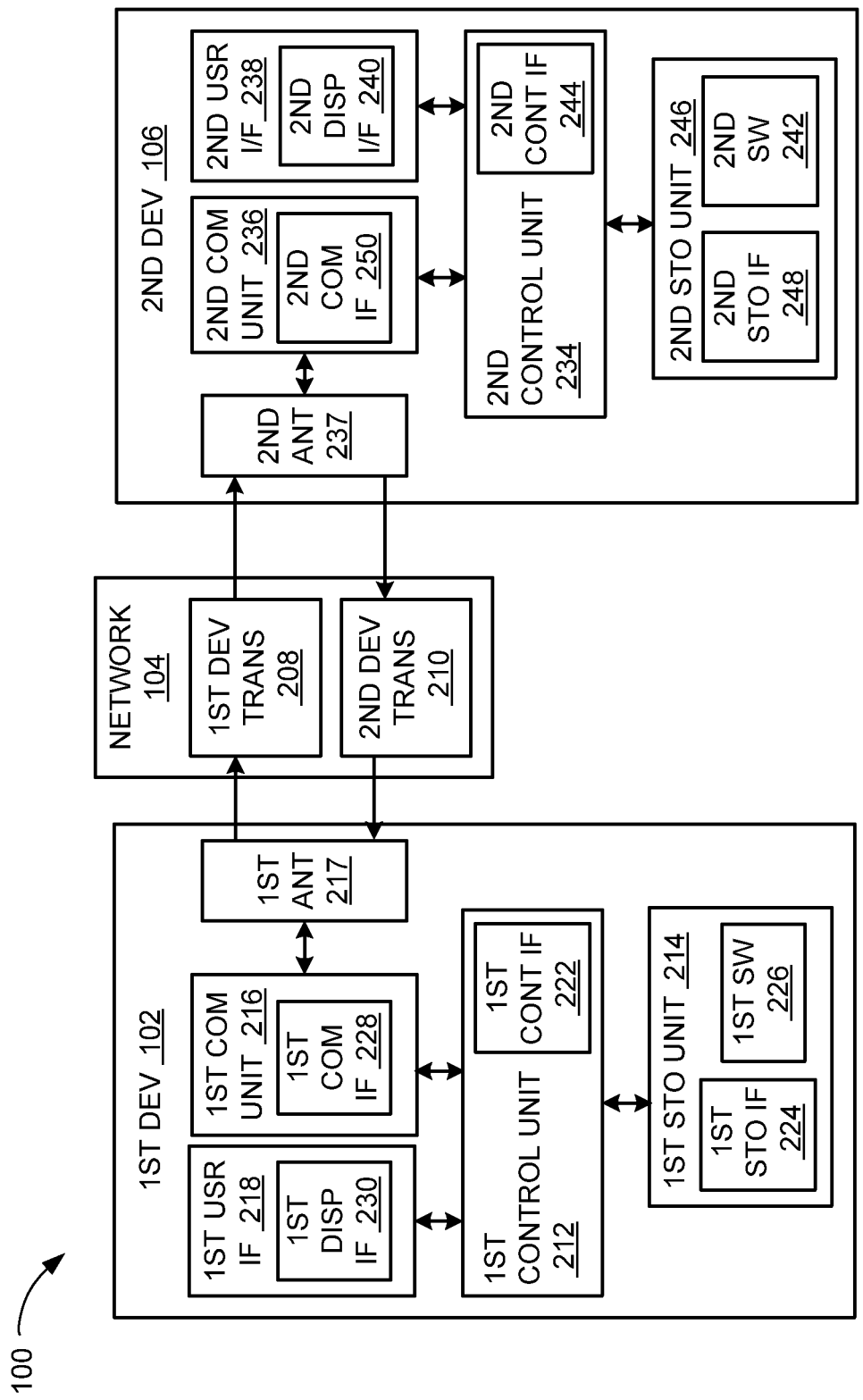
FIG. 2 is an exemplary block diagram of the communication system.

Referring now to FIG. 2, therein is shown an exemplary block diagram of the communication system 100. The communication system 100 can include the first device 102, the network 104, and the second device 106. The first device 102 can send information in a first device transmission 208 over the network 104 to the second device 106. The second device 106 can send information in a second device transmission 210 over the network 104 to the first device 102.

For illustrative purposes, the communication system 100 is shown with the first device 102 as a client device, although it is understood that the communication system 100 can have the first device 102 as a different type of device. For example, the first device 102 can be a server having a display interface.

Also for illustrative purposes, the communication system 100 is shown with the second device 106 as a server, although it is understood that the communication system 100 can have the second device 106 as a different type of device. For example, the second device 106 can be a client device.

For brevity of description in this embodiment of the present invention, the first device 102 will be described as a client device and the second device 106 will be described as a server device. The embodiment of the present invention is not limited to this selection for the type of devices. The selection is an example of an embodiment of the present invention.

The first device 102 can include a first control unit 212, a first storage unit 214, a first communication unit 216, and a first user interface 218, and a location unit 220. The first control unit 212 can include a first control interface 222. The first control unit 212 can execute a first software 226 to provide the intelligence of the communication system 100.

The first control unit 212 can be implemented in a number of different manners. For example, the first control unit 212 can be a processor, an application specific integrated circuit (ASIC) an embedded processor, a microprocessor, a hardware control logic, a hardware finite state machine (FSM), a digital signal processor (DSP), or a combination thereof. The first control interface 222 can be used for communication between the first control unit 212 and other functional units in the first device 102. The first control interface 222 can also be used for communication that is external to the first device 102.

The first control interface 222 can receive information from the other functional units or from external sources, or can transmit information to the other functional units or to external destinations. The external sources and the external destinations refer to sources and destinations external to the first device 102.

The first control interface 222 can be implemented in different ways and can include different implementations depending on which functional units or external units are being interfaced with the first control interface 222. For example, the first control interface 222 can be implemented with a pressure sensor, an inertial sensor, a microelectromechanical system (MEMS), optical circuitry, waveguides, wireless circuitry, wireline circuitry, or a combination thereof.

The first storage unit 214 can store the first software 226. The first storage unit 214 can also store the relevant information, such as data representing incoming images, data representing previously presented image, sound files, or a combination thereof.

The first storage unit 214 can be a volatile memory, a nonvolatile memory, an internal memory, an external memory, or a combination thereof. For example, the first storage unit 214 can be a nonvolatile storage such as nonvolatile random access memory (NVRAM), Flash memory, disk storage, or a volatile storage such as static random access memory (SRAM).

The first storage unit 214 can include a first storage interface 224. The first storage interface 224 can be used for communication between the first storage unit 214 and other functional units in the first device 102. The first storage interface 224 can also be used for communication that is external to the first device 102.

The first storage interface 224 can receive information from the other functional units or from external sources, or can transmit information to the other functional units or to external destinations. The external sources and the external destinations refer to sources and destinations external to the first device 102.

The first storage interface 224 can include different implementations depending on which functional units or external units are being interfaced with the first storage unit 214. The first storage interface 224 can be implemented with technologies and techniques similar to the implementation of the first control interface 222.

The first communication unit 216 can enable external communication to and from the first device 102. For example, the first communication unit 216 can permit the first device 102 to communicate with the second device 106, a different device, an attachment, such as a peripheral device or a desktop computer, the network 104, or a combination thereof.

The first communication unit 216 can also function as a communication hub allowing the first device 102 to function as part of the network 104 and not limited to be an end point or terminal unit to the network 104. The first communication unit 216 can include active and passive components, such as microelectronics or an antenna, for interaction with the network 104.

The first communication unit 216 can include a baseband device or component, a modem, a digital signal processor, or a combination thereof for transmitting, formatting, receiving, detecting, decoding, further processing, or a combination thereof for communication signals. The first communication unit 216 can include one or more portions for processing the voltages, the currents, the digital information, or a combination thereof, such as an analog-to-digital converter, a digital-to-analog converter, a filter, an amplifier, a processor-type circuitry, or a combination thereof. The first communication unit 216 can further include one or more portions for storing information, such as cache or RAM memory, registers, or a combination thereof.

The first communication unit 216 can be coupled with a first antenna 217. The first antenna 217 can be a device or a portion of a device for physically communicating signals. The first antenna 217 can communicate by transmitting or receiving signals to or from another device. The first antenna 217 can be for wireless signals. The first antenna 217 can include an omnidirectional antenna, a wire, an antenna chip, a ceramic antenna, or a combination thereof.

The first antenna 217 can detect or respond to a power in electromagnetic waves and provide the detected result to the first communication unit 216 to receive a signal, including the second device transmission 210. The first antenna 217 can provide a path or respond to currents or voltages provided by the first communication unit 216 to transmit a signal, including the first device transmission 208.

The first communication unit 216 can include a first communication interface 228. The first communication interface 228 can be used for communication between the first communication unit 216 and other functional units in the first device 102. The first communication interface 228 can receive information from the other functional units or can transmit information to the other functional units.

The first communication interface 228 can include different implementations depending on which functional units are being interfaced with the first communication unit 216. The first communication interface 228 can be implemented with technologies and techniques similar to the implementation of the first control interface 222.

The first user interface 218 allows a user (not shown) to interface and interact with the first device 102. The first user interface 218 can include an input device and an output device. Examples of the input device of the first user interface 218 can include a keypad, a touchpad, soft-keys, a keyboard, a microphone, an infrared sensor for receiving remote signals, or any combination thereof to provide data and communication inputs.

The first user interface 218 can include a first display interface 230. The first display interface 230 can include an output device. The first display interface 230 can include a display, a projector, a video screen, a speaker, or any combination thereof.

The first control unit 212 can operate the first user interface 218 to display information generated by the communication system 100. The first control unit 212 can also execute the first software 226 for the other functions of the communication system 100, including receiving location information from the location unit 220. The first control unit 212 can further execute the first software 226 for interaction with the network 104 via the first communication unit 216.

The location unit 220 can generate location information, current heading, current acceleration, and current speed of the first device 102, as examples. The location unit 220 can be implemented in many ways. For example, the location unit 220 can function as at least a part of the global positioning system, an inertial computing system, a cellular-tower location system, a pressure location system, or any combination thereof. Also, for example, the location unit 220 can utilize components such as an accelerometer or GPS receiver.

The location unit 220 can include a location interface 232. The location interface 232 can be used for communication between the location unit 220 and other functional units in the first device 102. The location interface 232 can also be used for communication external to the first device 102.

The location interface 232 can receive information from the other functional units or from external sources, or can transmit information to the other functional units or to external destinations. The external sources and the external destinations refer to sources and destinations external to the first device 102.

The location interface 232 can include different implementations depending on which functional units or external units are being interfaced with the location unit 220. The location interface 232 can be implemented with technologies and techniques similar to the implementation of the first control unit 212.

The second device 106 can be optimized for implementing an embodiment of the present invention in a multiple device embodiment with the first device 102. The second device 106 can provide the additional or higher performance processing power compared to the first device 102. The second device 106 can include a second control unit 234, a second communication unit 236, a second user interface 238, and a second storage unit 246.

The second user interface 238 allows a user (not shown) to interface and interact with the second device 106. The second user interface 238 can include an input device and an output device. Examples of the input device of the second user interface 238 can include a keypad, a touchpad, soft-keys, a keyboard, a microphone, or any combination thereof to provide data and communication inputs. Examples of the output device of the second user interface 238 can include a second display interface 240. The second display interface 240 can include a display, a projector, a video screen, a speaker, or any combination thereof.

The second control unit 234 can execute a second software 242 to provide the intelligence of the second device 106 of the communication system 100. The second software 242 can operate in conjunction with the first software 226. The second control unit 234 can provide additional performance compared to the first control unit 212.

The second control unit 234 can operate the second user interface 238 to display information. The second control unit 234 can also execute the second software 242 for the other functions of the communication system 100, including operating the second communication unit 236 to communicate with the first device 102 over the network 104.

The second control unit 234 can be implemented in a number of different manners. For example, the second control unit 234 can be a processor, an embedded processor, a microprocessor, hardware control logic, a hardware finite state machine (FSM), a digital signal processor (DSP), or a combination thereof.

The second control unit 234 can include a second control interface 244. The second control interface 244 can be used for communication between the second control unit 234 and other functional units in the second device 106. The second control interface 244 can also be used for communication that is external to the second device 106.

The second control interface 244 can receive information from the other functional units or from external sources, or can transmit information to the other functional units or to external destinations. The external sources and the external destinations refer to sources and destinations external to the second device 106.

The second control interface 244 can be implemented in different ways and can include different implementations depending on which functional units or external units are being interfaced with the second control interface 244. For example, the second control interface 244 can be implemented with a pressure sensor, an inertial sensor, a microelectromechanical system (MEMS), optical circuitry, waveguides, wireless circuitry, wireline circuitry, or a combination thereof.

A second storage unit 246 can store the second software 242. The second storage unit 246 can also store the information such as data representing incoming images, data representing previously presented image, sound files, or a combination thereof. The second storage unit 246 can be sized to provide the additional storage capacity to supplement the first storage unit 214.

For illustrative purposes, the second storage unit 246 is shown as a single element, although it is understood that the second storage unit 246 can be a distribution of storage elements. Also for illustrative purposes, the communication system 100 is shown with the second storage unit 246 as a single hierarchy storage system, although it is understood that the communication system 100 can have the second storage unit 246 in a different configuration. For example, the second storage unit 246 can be formed with different storage technologies forming a memory hierarchal system including different levels of caching, main memory, rotating media, or off-line storage.

The second storage unit 246 can be a volatile memory, a nonvolatile memory, an internal memory, an external memory, or a combination thereof. For example, the second storage unit 246 can be a nonvolatile storage such as nonvolatile random access memory (NVRAM), Flash memory, disk storage, or a volatile storage such as static random access memory (SRAM).

The second storage unit 246 can include a second storage interface 248. The second storage interface 248 can be used for communication between the second storage unit 246 and other functional units in the second device 106. The second storage interface 248 can also be used for communication that is external to the second device 106.

The second storage interface 248 can receive information from the other functional units or from external sources, or can transmit information to the other functional units or to external destinations. The external sources and the external destinations refer to sources and destinations external to the second device 106.

The second storage interface 248 can include different implementations depending on which functional units or external units are being interfaced with the second storage unit 246. The second storage interface 248 can be implemented with technologies and techniques similar to the implementation of the second control interface 244.

The second communication unit 236 can enable external communication to and from the second device 106. For example, the second communication unit 236 can permit the second device 106 to communicate with the first device 102 over the network 104.

The second communication unit 236 can also function as a communication hub allowing the second device 106 to function as part of the network 104 and not limited to be an end point or terminal unit to the network 104. The second communication unit 236 can include active and passive components, such as microelectronics or resistors, for interaction with the network 104.

The second communication unit 236 can include a baseband device or component, a modem, a digital signal processor, or a combination thereof for transmitting, formatting, receiving, detecting, decoding, further processing, or a combination thereof for communication signals. The second communication unit 236 can include one or more portions for processing the voltages, the currents, the digital information, or a combination thereof, such as an analog-to-digital converter, a digital-to-analog converter, a filter, an amplifier, a processor-type circuitry, or a combination thereof. The second communication unit 236 can further include one or more portions for storing information, such as cache or RAM memory, registers, or a combination thereof.

The second communication unit 236 can be coupled with a second antenna 237. The second antenna 237 can be a device or a portion of a device for physically communicating signals. The second antenna 237 can communicate by transmitting or receiving signals to or from another device. The second antenna 237 can be for wireless signals. The second antenna 237 can include an omnidirectional antenna, a wire, an antenna chip, a ceramic antenna, or a combination thereof.

The second antenna 237 can detect or respond to a power in electromagnetic waves and provide the detected result to the second communication unit 236 to receive a signal, including the first device transmission 208. The second antenna 237 can provide a path or respond to currents or voltages provided by the second communication unit 236 to transmit a signal, including the second device transmission 210.

The second communication unit 236 can include a second communication interface 250. The second communication interface 250 can be used for communication between the second communication unit 236 and other functional units in the second device 106. The second communication interface 250 can receive information from the other functional units or can transmit information to the other functional units.

The second communication interface 250 can include different implementations depending on which functional units are being interfaced with the second communication unit 236. The second communication interface 250 can be implemented with technologies and techniques similar to the implementation of the second control interface 244.

The first communication unit 216 can couple with the network 104 to send information to the second device 106 in the first device transmission 208. The second device 106 can receive information in the second communication unit 236 from the first device transmission 208 of the network 104.

The second communication unit 236 can couple with the network 104 to send information to the first device 102 in the second device transmission 210. The first device 102 can receive information in the first communication unit 216 from the second device transmission 210 of the network 104. The communication system 100 can be executed by the first control unit 212, the second control unit 234, or a combination thereof. For illustrative purposes, the second device 106 is shown with the partition having the second user interface 238, the second storage unit 246, the second control unit 234, and the second communication unit 236, although it is understood that the second device 106 can have a different partition. For example, the second software 242 can be partitioned differently such that some or all of its function can be in the second control unit 234 and the second communication unit 236. Also, the second device 106 can include other functional units not shown in FIG. 2 for clarity.

The functional units in the first device 102 can work individually and independently of the other functional units. The first device 102 can work individually and independently from the second device 106 and the network 104.

The functional units in the second device 106 can work individually and independently of the other functional units. The second device 106 can work individually and independently from the first device 102 and the network 104.

The functional units described above can be implemented in hardware. For example, one or more of the functional units can be implemented using the a gate, circuitry, a processor, a computer, integrated circuit, integrated circuit cores, a pressure sensor, an inertial sensor, a microelectromechanical system (MEMS), a passive device, a physical non-transitory memory medium having instructions for performing the software function, a portion therein, or a combination thereof.

For illustrative purposes, the communication system 100 is described by operation of the first device 102 and the second device 106. It is understood that the first device 102 and the second device 106 can operate any of the modules and functions of the communication system 100.

Figure 3:
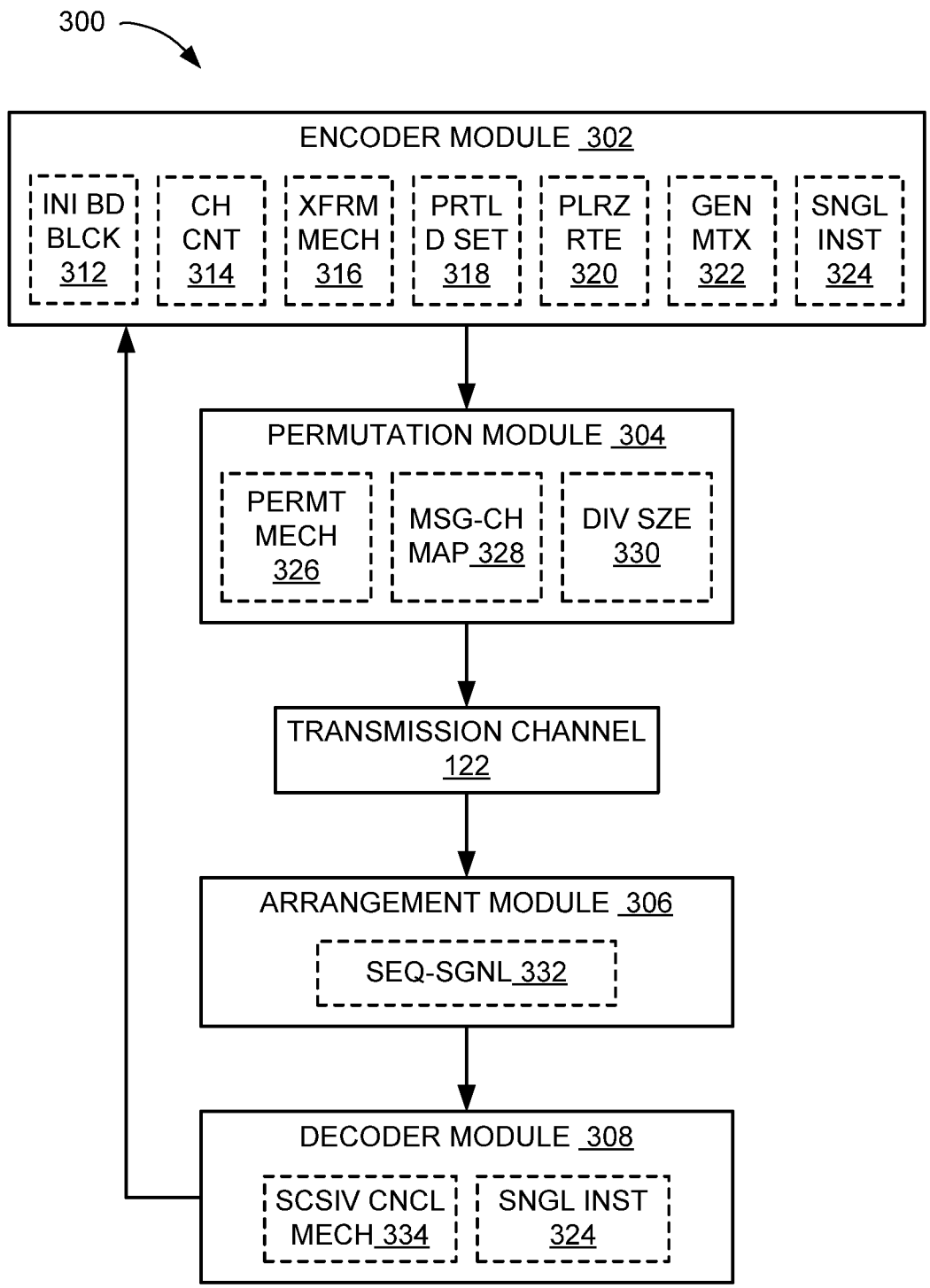
FIG. 3 is a control flow of the communication system.

Referring now to FIG. 3, therein is shown a control flow 300 of the communication system 100. The communication system 100 can include an encoder module 302, a permutation module 304, an arrangement module 306, a decoder module 308, or a combination thereof.

The encoder module 302 can be coupled to the permutation module 304, which can be further coupled to the arrangement module 306. The arrangement module 306 can be coupled to the decoder module 308, which can be further coupled to the encoder module 302.

The modules can be coupled to each other in a variety of ways. For example, modules can be coupled by having the input of one module connected to the output of another, such as by using wired or wireless connections, the network 104 of FIG. 1, instructional steps, process sequence, or a combination thereof. Also for example, the modules can be coupled either directly with no intervening structure other than connection means between the directly coupled modules, or indirectly with modules or devices other than the connection means between the indirectly coupled modules.

As a more specific example, one or more outputs of the encoder module 302 can be connected to one or more inputs of the permutation module 304 using conductors or the transmission channel 122 without no intervening modules or devices there-between. Also for example, the permutation module 304 can be coupled to the arrangement module 306 directly, similar to the encoder module 302 and the permutation module 304, or indirectly using the transmission channel 122 with a repeater, a switch, a routing device, or a combination thereof connecting the permutation module 304 and the arrangement module 306. Also for example, the arrangement module 306 can be directly coupled to the decoder module 308.

The communication system 100 can communicate with or using a device, such as by displaying images, recreating sounds, exchanging process steps or instructions, or a combination thereof. The communication system 100 can initiate the communication by sending information from a transmitting device to a receiving device. The receiving device can communicate with the user by displaying images, recreating sounds, exchanging process steps or instructions, or a combination thereof according to the information communicate to the device.

The encoder module 302 is configured to encode information for communication with the first device 102 of FIG. 1, the second device 106 of FIG. 1, or a combination thereof. The encoder module 302 can encode the information by determining the coded-message 112 of FIG. 1 corresponding to the communication content 108 of FIG. 1.

The encoder module 302 can determine the coded-message 112 according to the polar coding scheme 114 of FIG. 1 for polarizing the transmission channel 122, or instances thereof, including the channel 124 of FIG. 1 and the further channel 126 of FIG. 1. The encoder module 302 can determine the coded-message 112 according to the polar coding scheme 114 by determining the coded-message 112 based on an initial building block 312 and a transformation mechanism 316.

The encoder module 302 can calculate the initial building block 312. The initial building block 312 is a mechanism for polarizing the communication content 108 for transmission between devices. The initial building block 312 can represent a first polarization step generating l polarized instances of the bit channel 136 of FIG. 1. The initial building block 312 can be for determining the coded-message 112 for compound polar code, such as for utilizing multiple instances of the transmission channel 122 with the polar coding scheme 114.

The initial building block 312 can be a matrix value. The initial building block 312 can be based on a channel count 314. The channel count 314 can be a number of instances for the transmission channel 122 accessible to the communication system 100, the first device 102 therein, the second device 106 therein, or a combination thereof. The channel count 314 can be represented as 'l'. The initial building block can be l×l matrix. The encoder module 302 can determine the channel count 314 for representing instances of the transmission channel 122 including the channel 124 and the further channel 126.

For example, the encoder module 302 can calculate the initial building block 312 when the channel count 314 is a power of two, such as when $l=2^m$, as a transformation mechanism 316. The transformation mechanism 316 is a product of applying the Kronecker power to the channel polarization parameter to calculate the n-th Kronecker power. The transformation mechanism 316 can include the n-th Kronecker power as shown in Equation (2).

Continuing with the example, the encoder module 302 can include the transformation mechanism 316 as predetermined by the communication system 100, according to a standard, or a combination thereof. The encoder module 302 can further calculate the transformation mechanism 316. The initial building block 312 can be calculated when the channel count 314 is a power of two as:

$$G_0 = G^{\otimes n}.\qquad\text{Equation (4).}$$

The term '$G_0$' can represent the initial building block 312 and the term $G^{\otimes n}$ can represent the transformation mechanism 316.

It has been discovered that the initial building block 312 based on the transformation mechanism 316 for the channel count 314 of a power of two provides lower complexity in decoding the transmitter signal 110 after transmission. For the content block size 138 of FIG. 1 of $N=l2^n$, a simpler decoding algorithm for polar code of length $2^{n+m}$ can be used with complexity O (N log N).

Also for example, the encoder module 302 can calculate the initial building block 312 using a general approach, including when the channel count 314 is not a power of two, such as when $l \geq 3$. The encoder module 302 can consider a general instance of the transformation mechanism 316 for the general approach. A necessary and sufficient condition on an arbitrary instance of the channel polarization parameter, represented as l×l matrix G, can be provided for guaranteeing polarization for any binary symmetric memory-less (BSM) instance of the transmission channel 122.

Continuing with the example, the encoder module 302 can consider the general instance of the transformation mechanism 316, represented as $G^{\otimes n}$. The encoder module 302 can include or calculate the general instance of the transformation mechanism 316 as an invertible instance. The encoder module 302 can include or calculate the transformation mechanism 316 as an invertible matrix, the transformation mechanism 316 not including an upper triangular matrix.

Continuing with the example, the encoder module 302 can calculate or include a partial distance set 318. The partial distance set 318 can include a collection of partial distances for i=1, 2, . . . l as:

$$D_i \overset{\scriptscriptstyle\triangle}{=} d_H(g_i, \langle g_{i+1}, \ldots, g_l \rangle)), i=1,2,\ldots,l-1,$$

$$D_l \overset{\scriptscriptstyle\triangle}{=} d_H(g_l, 0).\qquad\text{Equation (5).}$$

Each instance of the partial distance in the partial distance set can be represented using the term '$D_i$'. Equation (5) can be for the l×l matrix $G=[g_1^T, g_2^T, \ldots, g_l^T]^T$. The partial distance set 318 can be the collection of partial distances based on elements within the channel polarization parameter G.

Continuing with the example, the encoder module 302 can calculate a polarization rate 320. The polarization rate 320 can be a representation of an amount or a degree of polarization achieved or achievable for the transmission channel 122. The encoder module 302 can calculate the polarization rate 320 based on the partial distance set 318. The encoder module 302 can calculate the polarization rate 320 based on:

$$E(G) = \frac{1}{l}\sum_{i=1}^{l} \log_l D_i. \qquad\text{Equation (6)}$$

The term '$E(G)$' can represent a method or a process of calculating the polarization rate 320 or the polarization rate 320 as a result thereof. The term '$D_i$' can correspond to the partial distance set 318 $\{D_i\}_{i=1}^{l}$ for BSM instance of the transmission channel 122 and l×l matrix G.

Continuing with the example, the encoder module 302 can calculate the initial building block 312 maximizing the polarization rate 320. The encoder module 302 can calculate the initial building block 312 corresponding to a maximum value of the polarization rate 320 based on Equation (6).

As a more specific example, the communication system 100 can utilize 3 instances of the transmission channel 122, such as for compound channels. The initial building block 312 represented as '$G_0$' can be 3×3 matrix. The encoder module 302 can pick the initial building block 312 maximizing the polarization rate 320. The encoder module 302 can use one step of polarization with the initial building block 312, giving criteria for choosing a reasonable instance of the initial building block 312. For the 3 instances of the transmission channel 122, a maximum instance of the polarization rate 320 can be $\frac{1}{3}\log_3 4 \approx 0.42$.

Continuing with the specific example, the initial building block 312 associated with the maximum instance of the polarization rate 320 can take various forms, such as $$G_0 = \begin{bmatrix} 1 & 0 & 0 \\ 1 & 1 & 0 \\ 0 & 1 & 1 \end{bmatrix}.$$

The partial distance set 318 can include $D_1=1, D_2=2, D_3=2$. The polarization rate 320 can be calculated as $\frac{1}{3}(\log_3 1 + \log_3 2 + \log_3 2) = \frac{1}{3}\log_3 4$.

The encoder module 302 can calculate the initial building block 312 based on the channel count 314. The encoder module 302 can combine the initial building block 312 and the transformation mechanism 316. The encoder module 302 can combine the initial building block 312 and the transformation mechanism 316 to calculate a generator matrix 322.

The generator matrix 322 can be calculated by applying the transformation mechanism 316 to the initial building block 312 for the polar coding scheme 114. The generator matrix 322 can be represented as '$G_0 G^{\otimes n} G^{\otimes n}$' or selected rows therein. The generator matrix 322 can further represent a set of instances of the bit channel 136 known to or estimated by the communication system 100 as being 'good'. The transformation mechanism 316 represented as $G^{\otimes n}$ can be based on 'G' as described above, such as for $$G = \begin{bmatrix} 1 & 0 \\ 1 & 1 \end{bmatrix}.$$

The encoder module 302 can further calculate the generator matrix 322 as a good bit-channel set based on an error probability estimation for each instance of the bit channel 136. The error probability estimation can be calculated by the encoder module 302, the decoder module 308, or a combination thereof.

The error probability estimation can be based on a feedback information from the decoder module 308. The error probability estimation can be calculated once. The error probability estimation can be calculated prior to communicating the communication content 108, such as during a negotiation or a setup process. The error probability estimation or a portion thereof can further be calculated offline, such as for lookup tables.

The encoder module 302 can sort the instances of the bit channel 136 according to the error probability estimation. The encoder module 302 can select an information-bit quantity, represented as 'k', as instances of the bit channel 136 having the lowest value of the error probability estimation as the generator matrix 322 for carrying the information bits. The information-bit quantity can be an integer number between 1 and N, with a rate of code represented as 'k/N'.

The encoder module 302 can determine the coded-message 112 based on the initial building block 312 and the transformation mechanism 316 by determining the coded-message 112 based on the generator matrix 322. For example, the encoder module 302 can determine the coded-message 112 by applying or multiplying each bit of the communication content 108 with the generator matrix 322.

The encoder module 302 can be a single instance module 324. The single instance module 324 is an only existing hardware implementation dedicated to encoding the communication content 108. The single instance module 324 can be the only encoder within the first device 102, the second device 106, or a combination thereof. The single instance module 324 can represent an absence of multiple identical or circuits having the same purpose or function of encoding signals. The single instance module 324 can be implemented along with a loop or recursive functions, such as using firmware or hardware feedback loops.

The encoder module 302 can determine the coded-message 112 for decoding with a specific mechanism. The details of the decoding process and the specific mechanism will be described below.

It has been discovered that the initial building block 312 based on the transformation mechanism 316 for general instances of the channel count 314 provides lower complexity in decoding the transmitter signal 110 after transmission. The initial building block 312 can enable use of estimated probability of error of the bit channels instead of using Bhattacharryaa parameters which are exponentially hard to compute, which present exponentially increasing processing difficulties.

It has further been discovered that the coded-message 112 based on the initial building block 312 and the transformation mechanism 316 provides transmission of polar code over the transmission channel 122 including compound channels. The initial building block 312 and the transformation mechanism 316 can polarize the signals according to the polar coding scheme 114 over multiple instances of the transformation mechanism 316, such as using the channel 124 and the further channel 126, or any other additional channels in addition thereto.

It has further been discovered that the coded-message 112 based on the initial building block 312 and the transformation mechanism 316 provides unified compound polar scheme for transmission over compound channels along with the capacity-achieving property for the compound channel. It has further been discovered that the generator matrix 322 provides increased throughput by enabling achievement of capacity. It has further been discovered that the coded-message 112 based on the initial building block 312 and the transformation mechanism 316 enables using the polar coding scheme 114 to encode data across the transmission channel for BICM.

It has further been discovered that the single instance module 324 for the encoder module 302 based on the initial building block 312 and the transformation mechanism 316 provides transmission of polar code over the transmission channel 122 including compound channels using one single encoder and one single decoder. The reduction in calculation complexity provided by the initial building block 312 and the transformation mechanism 316 can enable implementation of the encoder module 302 as the single instance module 324 for encoding the communication content 108.

It has further been discovered that based on the initial building block 312 and the transformation mechanism 316 provides an improved trade-off between rate and probability of frame error. The initial building block 312 and the transformation mechanism 316 can enable the single instance module 324 for the encoder module 302, instead of coding over compound channel using polar codes, particularly designed for each of the channels that require separate encoders and decoders.

The encoder module 302 can use the first user interface 218 of FIG. 2, the second user interface 238 of FIG. 2, the first communication interface 228 of FIG. 2, the second communication interface 250 of FIG. 2, or a combination thereof to access or receive the communication content 108 generated by the user, other users, the communication system 100, the devices therein, or a combination thereof. The encoder module 302 can use the first communication unit 216 of FIG. 2, the second communication unit 236 of FIG. 2, the first control unit 212 of FIG. 2, the second control unit 234 of FIG. 2, or a combination thereof to calculate the initial building block 312, calculate, access, apply, or a combination of processes thereof for the transformation mechanism 316 calculate the generator matrix 322, any other operation or processing described above for the encoder module 302, or a combination thereof.

The encoder module 302 can store the coded-message 112 or any intermediate product of the process, such as the initial building block 312 or the polarization rate 320, in the first communication unit 216, the second communication unit 236, the first storage unit 214 of FIG. 2, the second storage unit 246 of FIG. 2, or a combination thereof. The encoder module 302 can determine the channel count 314 based on the first antenna 217 of FIG. 2, the second antenna 237 of FIG. 2, or a combination thereof.

After determining the coded-message 112, the control flow can be passed to the permutation module 304. The control flow can pass through a variety of ways. For example, control flow can pass by having processing results of one module passed to another module, such as by passing the coded-message 112 from the encoder module 302 to the permutation module 304, by storing the processing results at a location known and accessible to the other module, such as by storing the coded-message 112 at a storage location known and accessible to the permutation module 304, by notifying the other module, such as by using a flag, an interrupt, a status signal, or a combination for the permutation module 304, or a combination of processes thereof.

The permutation module 304 is configured to format the coded-message 112 for communication between devices. For example, the permutation module 304 can divide, arrange, or a combination thereof for the coded-message 112 based on the channel count 314. Also for example, the permutation module 304 can divide, arrange, or a combination thereof for the coded-message 112 based on a size of the generator matrix 322.

The permutation module 304 can format the coded-message 112 to generate and communicate the transmitter signal 110. For example, the permutation module 304 can implement a permutation mechanism 326 to format the coded-message 112. Also for example, the permutation module 304 can generate a message-channel map 328 for formatting the coded-message 112. Also for example, the permutation module 304 can format the coded-message 112 by determining the transmitter information 132 of FIG. 1 and the further transmitter information 134 of FIG. 1 based on the coded-message 112.

The permutation module 304 can implement the permutation mechanism 326 for mapping the bit channel 136 associated with the polar coding scheme 114 to instances of the transmission channel 122. The permutation mechanism 326 is a process or a method for formatting or arranging information according to various channels for communication.

The permutation mechanism 326 can be for formatting or arranging the coded-message 112 to generate and communicate the transmitter signal 110. The permutation mechanism 326 can include circuitry, gates, active or passive components, firmware, or a combination thereof for implementing instructions or steps for formatting the coded-message 112. The permutation mechanism 326 can be for implementing a compound polar transformation according to the polar coding scheme 114.

The permutation mechanism 326 can include instructions, steps, circuitry, or a combination thereof for dividing the coded-message 112 based on the channel count 314, the content block size 138, or a combination thereof. The permutation mechanism 326 can be for dividing the coded-message 112 into sections having a division size 330 based on the content block size 138 and the channel count 314. The division size 330 can be based on a ratio between the content block size 138 and the channel count 314, represented as N/l, or a multiple thereof. The division size 330 can further be based on a positive integer number, including 1 and greater numbers.

The permutation mechanism 326 can be for dividing encoded bits of the coded-message 112 into the transmitter information 132 having a size of the division size 330, such as for N/l encoded bits. The permutation mechanism 326 can be for determining the transmitter information 132 as set encoded bits of the coded-message 112 having the division size 330 for transmission through a number of independent copies same as the division size 330 for the channel 124.

The permutation mechanism 326 can be for determining the further transmitter information 134 or other additional transmitter information as the next sequential amount of encoded bits of the coded-message 112 having the division size 330. Each instance of the transmitter information can be for transmission through a number of independent copies same as the division size 330 for corresponding instance of the transmission channel 122.

For example, the permutation mechanism 326 can be for determining the further transmitter information 134 as the following N/l encoded bits of the coded-message 112 after the transmitter information 132. The further transmitter information 134 can be for transmitting N/l encoded bits through N/l independent copies of the further channel 126.

The permutation mechanism 326 can include implementations for arranging the transmitter information 132 and the further transmitter information 134, and any additional sections of the transmitter information. For example, the permutation mechanism 326 can include implementations for arranging a correspondence to instances of the first antenna 217, the second antenna 237, or a combination thereof, arranging a timing sequence, arranging a correspondence to instances of the bit channel 136, or a combination thereof for communicating the communication content 108 between devices.

The permutation module 304 can generate the message-channel map 328 for mapping the coded-message 112 or portions therein to instances of the transmission channel 122 based on the permutation mechanism 326. The message-channel map 328 is a plan, a schematic, an association or a correspondence, or a combination thereof for associating portions of the coded-message 112 to specific instances of the transmission channel 122.

For example, the message-channel map 328 can include loading specific portions of the coded-message 112 into specific buffers, establishing connections or paths, designating destinations, or a combination thereof for the transmitter information 132, the further transmitter information 134, any additional sections of the transmitter information, or a combination thereof transmitting through the channel 124, the further channel 126, any additional channels, or a combination thereof for the transmission channel 122. Also for example, the message-channel map 328 can include a table associating specific portions or divisions of the coded-message 112 to one or more antenna portions for the first antenna 217, the second antenna 237, or a combination thereof.

The permutation mechanism 326 can also include implementations for alternative division and arrangements. The permutation mechanism 326 can include implementations for simultaneous communications over all available instances of the transmission channel 122, scheduling rotating sequence for instances of the transmission channel 122, a specific timing for the instances of the transmission channel 122, or a combination thereof.

It has been discovered that the permutation mechanism 326 provides transmission of polar code over the transmission channel 122 including compound channels. The permutation mechanism 326 enables each of the channels in the compound or multiple channel communication to achieve polarization. It has further been discovered that the permutation mechanism 326 based on the division size 330 of N/l enables unified compound polar scheme for transmission over compound channels along with the capacity-achieving property for the compound channel.

It has further been discovered that the permutation mechanism 326, the initial building block 312, and the transformation mechanism 316 provides decreased complexity in encoding and decoding signals using polar codes over compound channels. It has further been discovered that the permutation mechanism 326, the initial building block 312, and the transformation mechanism 316 enables the single instance module 324 for the encoder module 302 for transmission of polar code over the transmission channel 122 including compound channels due to the reduced complexity.

It has further been discovered that the message-channel map 328 provides unified compound polar scheme for transmission over compound channels along with the capacity-achieving property for the compound channel. The message-channel map 328 can detail a method or a process according to the polar coding scheme 114 and the permutation mechanism 326 for implementing communications with unified compound polar scheme for transmission over compound channels.

The permutation module 304 can use the first communication unit 216, the second communication unit 236, the first control unit 212, the second control unit 234, or a combination thereof to format the coded-message 112 to determine or generate the transmitter signal 110, the transmitter information 132, the further transmitter information 134, any additional transmitter information, a derivation thereof, or a combination thereof. The permutation module 304 can store the transmitter signal 110 or any intermediate processing results described above in the first communication unit 216, the second communication unit 236, the first storage unit 214, the second storage unit 246, or a combination thereof.

The permutation module 304 can communicate the transmitter signal 110 including the transmitter information 132, the further transmitter information 134, any additional instances of transmitter information, a derivation thereof, or a combination thereof by transmitting the transmitter signal 110 using the first antenna 217, the second antenna 237, or a combination thereof. The permutation module 304 can use the first antenna 217, the second antenna 237, or a combination thereof to transmit the transmitter signal 110 based on the coded-message 112 or a division thereof, including the transmitter information 132 and the further transmitter information 134 or derivations thereof, according to the message-channel map 328 for communicating the transmitter signal 110 through instances of the transmission channel 122.

The transmitter signal 110 can correspond to the receiver signal 120 of FIG. 1 and traverse the transmission channel 122. The transmitter information 132 can be communicated through the channel 124 and correspond to the receiver information 128, represented as '$Y_1$', the further transmitter information 134 can be communicated through the further channel 126 and correspond to the further receiver information 130 of FIG. 1, represented as '$Y_2$', or a combination thereof.

The transmitter signal 110 can further represent the communication content 108 communicated using the polar coding scheme 114. The transmitter signal 110 can further represent the communication content 108 communicated utilizing BICM for the transmission channel 122.

After formatting the coded-message 112 and communicating corresponding instance of the transmitter signal 110, the control flow can be passed to the arrangement module 306. The control flow can pass similarly as described above between the encoder module 302 and the permutation module 304, but using the processing results of the permutation module 304, such as the transmitter signal 110.

The arrangement module 306 is configured to receive the communication between devices and sequentially order the received information. The arrangement module 306 can receive the receiver signal 120.

The arrangement module 306 can receive the receiver signal 120 including the receiver information 128, the further receiver information 130, any additional receiver information, a derivation thereof, or a combination thereof corresponding to the channel 124, the further channel 126, any additional instances of the transmission channel 122, or a combination thereof. The arrangement module 306 can receive the receiver signal 120 corresponding to the transmitter signal 110 using the first antenna 217, the second antenna 237, or a combination thereof.

The arrangement module 306 can receive the receiver signal 120 communicated using the polar coding scheme 114. The arrangement module 306 can receive the receiver signal 120 communicated utilizing BICM for the transmission channel 122. The arrangement module 306 can receive the receiver signal 120 corresponding to the transmitter information 132 and the further transmitter information 134 based on the coded-message 112 and the channel count 314.

The arrangement module 306 can determine the channel count 314 for representing instances of the transmission channel 122 including the channel 124 and the further channel 126. The arrangement module 306 can determine the channel count 314 based on information or indications in the receiver signal 120, based on a number of portions in the first antenna 217, the second antenna 237, or a combination thereof, or based on a combination thereof.

The arrangement module 306 can further process the receiver signal 120. The arrangement module 306 can further process the receiver signal 120 by positioning the portions of the receiver signal 120. The arrangement module 306 can generate a sequenced-signal 322 by positioning the portions of the receiver signal 120. The sequenced-signal 322 is an arrangement of information based on the receiver signal 120 having a sequence for information originally intended for processing.

For example, the arrangement module 306 can generate the sequenced-signal 322 by combining different portions of the receiver signal 120 received through different instances of the transmission channel 122. As a more specific example, the arrangement module 306 can generate the sequenced-signal 322 by combining two or more from the receiver information 128, the further receiver information 130, any other receiver information, and a derivation thereof according to a specific order or sequence.

Also for example, the arrangement module 306 can generate the sequenced-signal 322 by combining different portions of the receiver signal 120 received simultaneously or in parallel using multiple antenna portions, such as for multiple-input multiple-output (MIMO) communication scheme. Also for example, the arrangement module 306 can generate the sequenced-signal 322 by interleaving or de-interleaving the receiver signal 120.

The arrangement module 306 can generate the sequenced-signal 322 according to a process or a method known to the communication system 100 for both of the transmitting device and the receiving device. The arrangement module 306 can generate the sequenced-signal 322 according to the permutation mechanism 326 or a derivation thereof.

For example, the arrangement module 306 can invert the dividing or assigning process of the permutation module 304 based on the permutation mechanism 326 or a derivation thereof, such as an inversion. As a more specific example, the arrangement module 306 can start with the encoded bits having a size of the division size 330 in the receiver signal 120 corresponding to independent copies same as the division size 330 for the channel 124. The arrangement module 306 can add the encoded bits having a size of the division size 330 in the receiver signal 120 corresponding to independent copies same as the division size 330 for a next-occurring instance of the transmission channel 122, such as the further receiver information 130, thereafter.

As a further specific example, the arrangement module 306 can determine the initial N/l encoded bits of the receiver signal 120 corresponding to N/l independent copies for the channel 124 as an initial portion of the sequenced-signal 322. The arrangement module 306 can determine the initial N/l encoded bits of the receiver signal 120 corresponding to N/l independent copies for the further channel 126 as a next-sequential portion of the sequenced-signal 322 following the initial portion. The arrangement module 306 can similarly generate the sequenced-signal 322 according to an order for instances of the transmission channel 122, a timing schedule, a rotation order, an arrangement pattern, or a combination thereof according to the permutation mechanism 326, including the message-channel map 328.

The arrangement module 306 can be a counterpart to the permutation module 304. The arrangement module 306 can reverse or invert the dividing and rearranging processes performed by the permutation module 304. Likewise, the sequenced-signal 322 can be similar or parallel to the coded-message 112.

The arrangement module 306 can implement the permutation mechanism 326 or a derivation thereof for mapping instances of the bit channel 136 associated with the polar coding scheme 114 to one of the instances of the transmission channel 122. The arrangement module 306 can generate the sequenced-signal 322 based on mapping each instance of the bit channel 136 for the receiver signal 120 to the channel 124, the further channel 126, any additional instances of the transmission channel 122, or a combination thereof.

The mapping for the bit channel 136 can be based on positioning the portions of the receiver signal 120 according to the message-channel map 328 or a derivation thereof as described above. The arrangement module 306 can correspond to mapping the coded-message 112 to the instances of the transmission channel 122 as processed by the permutation module 304.

It has been discovered that the sequenced-signal 322 generated based on the permutation mechanism 326 provides communication with polar code over the transmission channel 122 including compound channels. The permutation mechanism 326 enables rearranging for each of the channels in the compound or multiple channel communication based on achieving polarization. It has further been discovered that the sequenced-signal 322 generated based on the division size 330 of N/l enables unified compound polar scheme for transmission over compound channels along with the capacity-achieving property for the compound channel.

It has further been discovered that the permutation mechanism 326, the initial building block 312, and the transformation mechanism 316 provides decreased complexity in encoding and decoding signals using polar codes over compound channels. It has further been discovered that the permutation mechanism 326, the initial building block 312, and the transformation mechanism 316 enables the single instance module 324 for the decoder module 308 for decoding the polar code received over the transmission channel 122 including compound channels due to the reduced complexity.

It has further been discovered that the sequenced-signal 322 generated based on provides unified compound polar scheme for transmission over compound channels along with the capacity-achieving property for the compound channel. The message-channel map 328 can detail a method or a process for rearranging the receiver signal 120 according to the polar coding scheme 114 and the permutation mechanism 326 for implementing communications with unified compound polar scheme for communications over compound channels.

The arrangement module 306 can use the first communication unit 216, the second communication unit 236, the first control unit 212, the second control unit 234, or a combination thereof to generate the sequenced-signal 322. The arrangement module 306 can store the sequenced-signal 322 or any intermediate processing results described above in the first communication unit 216, the second communication unit 236, the first storage unit 214, the second storage unit 246, or a combination thereof.

After generating the sequenced-signal 322, the control flow can be passed to the decoder module 308. The control flow can pass similarly as described above between the encoder module 302 and the permutation module 304, but using the processing results of the arrangement module 306, such as the sequenced-signal 322.

The decoder module 308 is configured to decode the receiver signal 120 to calculate the decoding result representing an estimation of the communication content 108. The decoder module 308 can determine or estimate the communication content 108 for the receiving device based on the sequenced-signal 322 for communicating the communication content 108 intended by the transmitter signal 110 of the transmitting device.

The decoder module 308 can be associated with or parallel to the encoder module 302. The decoder module 308 can reverse or invert the processes perform by the encoder module 302. The decoder module 308 can be for decoding the sequenced-signal 322 similar to or parallel to the coded-message 112 according to the polar coding scheme 114. The decoder module 308 can decode the sequenced-signal 322 based on the initial building block 312 or a derivation thereof, based on the transformation mechanism 316 or a derivation thereof, or a combination thereof. The decoder module 308 can decode the sequenced-signal 322 or the corresponding coded-message 112 based on the initial building block 312 maximizing the polarization rate 320 and the invertible instance of the initial building block 312.

The decoder module 308 can decode the sequenced-signal 322 using a successive cancellation mechanism 334 or a polar decoder. The successive cancellation mechanism 334 is a process or a method for decoding communication signals using iterative repetition of same or similar steps or instructions. The successive cancellation mechanism 334 can include circuitry, gates, active or passive components, firmware, or a combination thereof for implementing instructions or steps for decoding communication signals. The successive cancellation mechanism 334 can be for can be for implementing a compound polar transformation according to the polar coding scheme 114.

The decoder module 308 can decode the sequenced-signal 322 according to the successive cancellation mechanism 334 by calculating a likelihood function for the i-th instance of the bit channel 136, represented as '$L_N^{(i)}$'. The 'N' can represent the content block size 138, which can further be based on the channel count 314, represented as $N=l2^n$ with $n \geq 1$. The decoder module 308 can calculate the likelihood function recursively using calculations derived from the bit-channel recursion formulas given the channel observation and underlying channels' characteristics according to the successive cancellation mechanism 334.

For example, the decoder module 308 can calculate the likelihood function using the estimate of the transmission channel 122, the receiver signal 120 represented as '$y_1^N$', a logarithmic likelihood calculations, a ratio or a derivation thereof, or a combination thereof. As a more specific example, the successive cancellation mechanism 334 can include process or implementations for calculating a likelihood ratio (LR) for the receiver signal 120 for the channel count 314 of three.

Continuing with the example, the receiver information 128 can be used to calculate a first likelihood ratio, represented as $L_1$, the further receiver information 130 to calculate a second likelihood ratio, represented as $L_2$, any third instance of the receiver information a third likelihood ratio, represented as $L_3$, or a combination thereof. The decoder module 308 can calculate the likelihood function for the channel count 314 of three as:

$$LR(u_1 \mid y_1, y_2, y_3) = \frac{L_1 + L_2 + L_3 + L_1 L_2 L_3}{1 + L_1 L_2 + L_1 L_3 + L_2 L_3}. \qquad \text{Equation (7)}$$

$$LR(u_2 \mid y_1, y_2, y_3, u_1) = L_1^{1-2u_1} \frac{1 + L_1 L_2}{L_2 + L_3}.$$

$$LR(u_3 \mid y_1, y_2, y_3, u_1, u_2) = L_2^{1-2u_2} L_3.$$

For equation (7), the receiver information 128 can be represented as '$y_1$', the further receiver information 130 can be represented as '$y_2$', and the third instance of the receiver information can be represented as '$y_3$'. Correspondingly, the transmitter information 132 can be represented as '$u_1$', the further receiver information 130 can be represented as '$u_2$', the third instance of the transmitter information can be represented as '$u_3$'. The successive cancellation mechanism 334 can further include a method or an implementation similar to Equation (7) for a general instance of the channel count 314, for the channel count 314 of 2, or a combination thereof.

The successive cancellation mechanism 334 can include the method or the process, or an implementation thereof, for calculating the likelihood function or a result thereof. The decoder module 308 can include the successive cancellation mechanism 334 as predetermined by the communication system 100, a standard, or a combination thereof. The successive cancellation mechanism 334 can be for arranging the first and second halves of the bits as even-odd interlaced through bit-reversal of their indices.

The decoder module 308 can be the single instance module 324. The decoder module 308 can be implemented as the single instance module 324 with the successive cancellation mechanism 334. The decoder module 308 can be implemented along with or including a loop or a recursive function, such as using firmware or a hardware feedback loop.

The decoder module 308 can calculate an error parameter based on the likelihood function. The decoder module 308 can generate and transmit a feedback information including the likelihood function or a result thereof, the error parameter, or a combination thereof. For example, the feedback information can include an acknowledgement reply, the estimate or a state for the transmission channel 122, other protocol-based replies, or a combination thereof. The encoder module 302 can use the feedback information for further processing as described above.

It has been discovered that the initial building block 312, the transformation mechanism 316, and the successive cancellation mechanism 334 provides lower complexity in decoding the receiver signal 120. The initial building block 312 can enable use of estimated probability of error of the bit channels instead of using Bhattacharryaa parameters which are exponentially hard to compute, which present exponentially increasing processing difficulties. It has been discovered that the decoder module 308 as the single instance module 324 provides unified compound polar scheme and simpler processing based on the reduction in complexity and size.

The control flow 300 or the method 300 of operation of the communication system 100 includes: receiving a receiver signal with an antenna for communicating a transmitter signal corresponding to the receiver signal over transmission channels according to a polar coding scheme; generating a sequenced-signal based on the receiver signal according to a permutation mechanism with a communication unit; and determining a communication content based on the sequenced-signal for communicating the communication content intended by the transmitter signal with a device.

The control flow 300 or the method 300 of operation of the communication system 100 further includes: determining a coded-message with a communication unit for representing a communication content according to a polar coding scheme; generating a message-channel map for mapping the coded-message to transmission channels; and transmitting a transmitter signal with an antenna based on the coded-message according to the message-channel map for communicating the transmitter signal through the transmission channels with a device.

The modules described in this application can be hardware implementation or hardware accelerators, including passive circuitry, active circuitry, or both, in the first communication unit 216, the second communication unit 236, the first control unit 216, the second control unit 238, or a combination thereof. The modules can also be hardware implementation or hardware accelerators, including passive circuitry, active circuitry, or both, within the first device 102 or the second device 106, but outside of the first communication unit 216, the second communication unit 236, the first control unit 216, the second control unit 238, or a combination thereof.

The communication system 100 has been described with module functions or order as an example. The communication system 100 can partition the modules differently or order the modules differently. For example, the functions of the encoder module 302 and the permutation module 304 can be combined. Also for example, the arrangement module 306 can include a sub-module for receiving the receiver signal 120. Also for example, the communication system 100 can include a separate module following the permutation module 304 to further process the transmitter signal 110, such as according to a modulation scheme, transmit the transmitter signal 110, or a combination thereof.

For illustrative purposes, the various modules have been described as being specific to the first device 102 or the second device 106. However, it is understood that the modules can be distributed differently. For example, the various modules can be implemented in a different device, or the functionalities of the modules can be distributed across multiple devices. Also as an example, the various modules can be stored in a non-transitory memory medium.

As a more specific example, one or more modules described above can be stored in the non-transitory memory medium for distribution to a different system, a different device, a different user, or a combination thereof, for manufacturing, or a combination thereof. Also as a more specific example, the modules described above can be implemented or stored using a single hardware unit, such as a chip or a processor, or across multiple hardware units.

The modules described in this application can be stored in the non-transitory computer readable medium. The first communication unit 216, the second communication unit 236, the first storage unit 214, the second storage unit 246, or a combination thereof can represent the non-transitory computer readable medium. The first communication unit 216, the second communication unit 236, first storage unit 214, the second storage unit 246, or a combination thereof, or a portion therein can be removable from the first device 102, the second device 106, or a combination thereof. Examples of the non-transitory computer readable medium can be a non-volatile memory card or stick, an external hard disk drive, a tape cassette, or an optical disk.

The physical transformation from the polar coding scheme 114 over the compound instance of the transmission channel 122 results in the movement in the physical world, such as content displayed or recreated for the user on the first device 102. The content, such as navigation information or voice signal of a caller, reproduced on the first device 102 can influence the user's movement, such as following the navigation information or replying back to the caller. Movement in the physical world results in changes to the transmission channel 122, the feedback information, which can be fed back into the communication system 100 and influence the initial building block 312 or the polarization rate 320 to further process the receiver signal 120.

Figure 4:
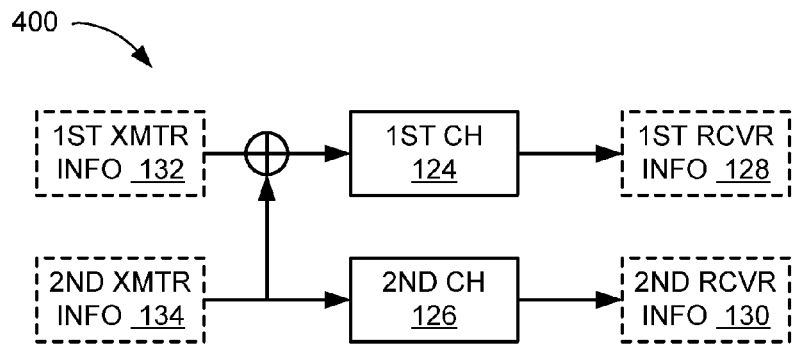
FIG. 4 is an exemplary block diagram of the communication system.

Referring now to FIG. 4, therein is shown an exemplary block diagram 400 of the communication system 100 of FIG. 1. The exemplary block diagram 400 can describe the communication system 100 utilizing the compound instances of the transmission channel 122 of FIG. 1 having the channel count 314 of FIG. 3 of 2. The communication system 100 can transmit the transmitter information 132 and the further transmitter information 134 using the channel 124 and the further channel 126 for receiving the receiver information 128 and the further receiver information 130.

Figure 5:
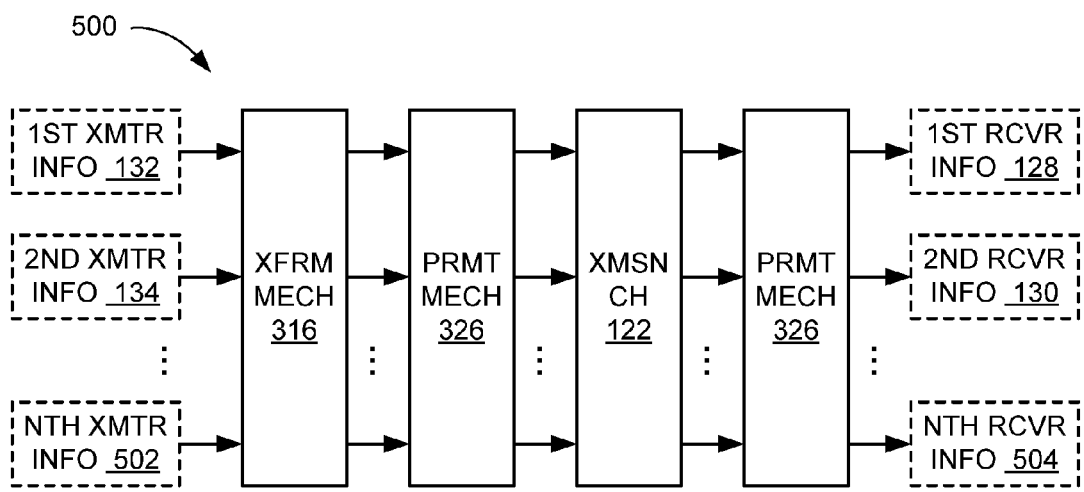
FIG. 5 is a detailed alternative control flow of the communication system.

Referring now to FIG. 5 therein is shown a detailed alternative control flow 500 of the communication system 100 of FIG. 1. The detailed alternative control flow 500 can be based on applying the transformation mechanism 316 of FIG. 3 to the exemplary block diagram 400 of FIG. 4, including the initial building block 312 of FIG. 3.

The communication system 100 can use the encoder module 302 of FIG. 3 to construct the coded-message 112 of FIG. 1 for the polar coding scheme 114 of FIG. 1. The coded-message 112 can be processed for the content block size 138 of FIG. 1. The encoder module 302 can apply the transformation mechanism 316 to the exemplary block diagram 400, including the initial building block 312 of FIG. 3. The application of the transformation mechanism 316 and the initial building block 312 can further polarize the two instances of the bit channel 136 of FIG. 1.

The transmission channel 122 of FIG. 1 can include 'N/2' instances of multiple independent copies of the channel 124 of FIG. 4 and 'N/2' independent copies of the further channel 126 of FIG. 4. The transmission channel 122 can include the multiple instances under an arbitrary order.

The coded-message 112 can correspond to instances up to an nth transmitter information 502. The corresponding instance of the receiver signal 120 of FIG. 1 can include up to an nth receiver information 504.

The permutation mechanism 326 can include various different implementations as described above for the permutation module 304 of FIG. 3. For example, the first half of the encoded bits, $x_1, x_2, \ldots, x_{N/2}$, can be transmitted through $W_1$ and the second half of encoded bits, $$x_{\frac{N}{2}+1}, \ldots, x_N,$$

can be transmitted through $W_2$. The permutation mechanism 326 can be represented as '$\pi$'. For constructing the code having the content block size 138 of N, or i=1, 2, ..., N, $u_i$ is either set to zero or to carry an information bit depending on whether it observes a bad bit-channel or good bit-channel.

Figure 6:
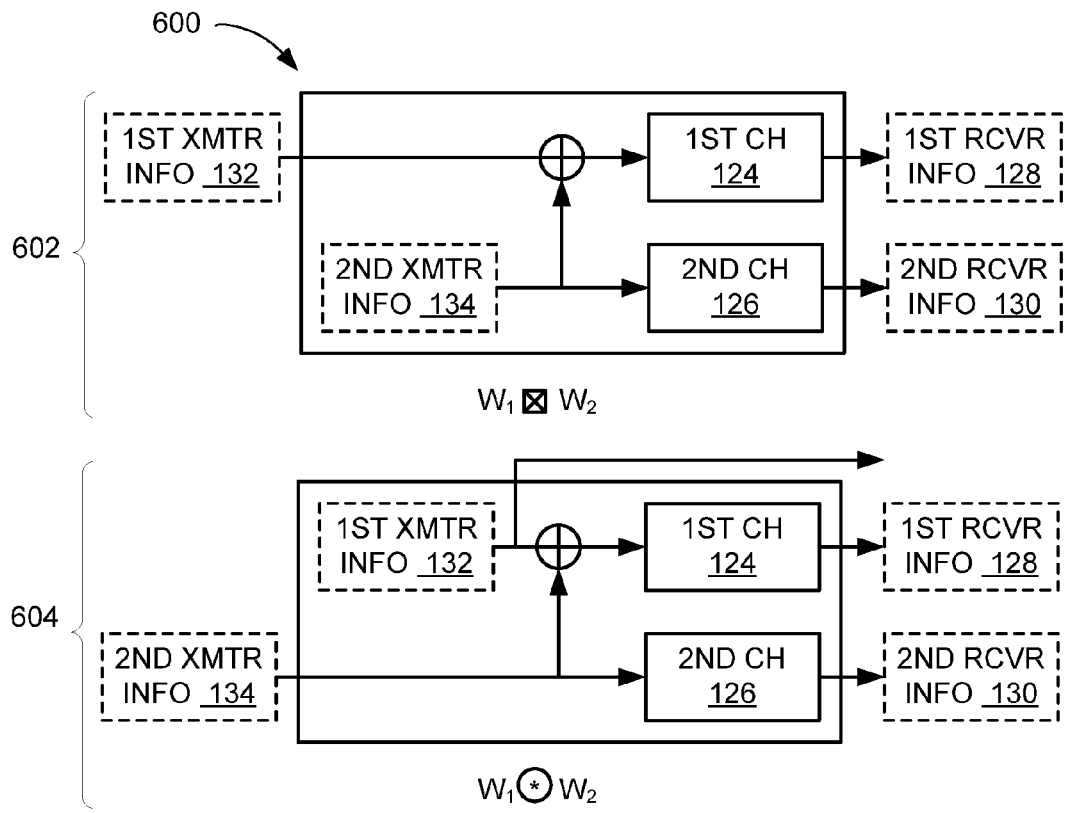
FIG. 6 is a block diagram exemplifying channel combining operation.

Referring now to FIG. 6, therein is shown a block diagram 600 for exemplifying channel combining operation. The block diagram 600 can detail the channel combining operation shown in FIG. 4.

The channel combining operation can be represented as a first operation 602 and a second operation 604. The first operation 602 can be represented as '$W_1 \boxtimes W_2$' and the second operation 604 can be represented as '$W_1 \circledcirc W_2$'.

For $W_1: X \to Y_1$ and $W_2: X \to Y_2$ with $W_1$ and $W_2$ representing two binary-input discrete memory-less channels of the channel 124 and the further channel 126 and $X=\{0, 1\}$, the first operation 602 can be further represented as $W_1 \boxtimes W_2$: $X \to Y_1 \times Y_2$ denoting another B-DMC. The transition probability for the first operation 602 for any $(y_1, y_2) \in Y_1 \times Y_2$ and $u \in X$ can be given by:

$$W_1 \boxtimes W_2(y_1, y_2|u) = \tfrac{1}{2} \sum_{x \in X} W_1(y_1|u \oplus x) W_2(y_2|u). \quad \text{Equation (8)}.$$

For the same conditions as described for the first operation, the second operation 604 can be further represented as $W_1 \circledcirc W_2$: $X \to Y_1 \times Y_2 \times X$. The second operation 604 can denote another B-DMC whose transition probability for any $(y_1, y_2) \in Y_1 \times Y_2$ and $x, u \in X$ can be given by:

$$W_1 \circledcirc W_2(y_1, y_2, x|u) = \tfrac{1}{2} W_1(y_1|u \oplus x) W_2(y_2|u) \quad \text{Equation (9)}$$

The detailed alternative control flow 500 of FIG. 5 can be equivalent to implementing the polar coding scheme 114 of FIG. 1, such as with the initial building block 312 of FIG. 3, the transformation mechanism 316 of FIG. 3, or a combination thereof as described above for the encoder module 302 of FIG. 3, into combined channels $W_1 \boxtimes W_2$ and $W_1 \circledcirc W_2$ in parallel. The channel polarization theorem for the detailed alternative control flow 500 can be established using results for $W_1 \boxtimes W_2$ and $W_1 \circledcirc W_2$ separately. The polar transformation of implementing the polar coding scheme 114 can be represented as $G^{\otimes n}$.

The individual instances of the bit channel 136 of FIG. 1 can be described in a similar way. For uniform, independent, and identically distributed random variables represented by $u_1, u_2, \ldots, u_N$, and with $\tilde{W}$ denoting the channel from $u_1^N$ to $y_1^N$, the i-th bit-channel, denoted by $(W_1 \cdot W_2)_N^{(i)}: X \to Y^N \times X^{i-1}$, can be represented with transition probability given by:

$$(W_1 \cdot W_2)_N^{(i)}(y_1^N, u_1^{i-1} | u_i) \stackrel{\text{def}}{=} \qquad \text{Equation (10)}$$

$$\frac{1}{2^{N-1}} \sum_{\overline{u} \in X^{N-i}} \tilde{W}(y_1^N | ((u_1^{i-1}, u_i, \overline{u})).$$

The communication system 100 can multiply a vector $u_1^N$ for the communication content 108 by the transformation mechanism 316 $G^{\otimes n}$ and transmit the resulting transmitter signal 110 through N channels $W_1, W_2, \ldots, W_N$. The communication system 100 can use the encoder module 302 and the permutation module 304 to multiply, arrange, and transmit as described above.

For example, the encoder module 302, the permutation module 304, or a combination thereof can sort the bit-channels based on their estimated probability of error using the feedback information in an ascending order. Then encoder module 302, the permutation module 304, or a combination thereof can pick the first N/2 of the sorted channels to carry the information bits. The selected channels can be used to generate the message-channel map 328 of FIG. 3.

Figure 7:
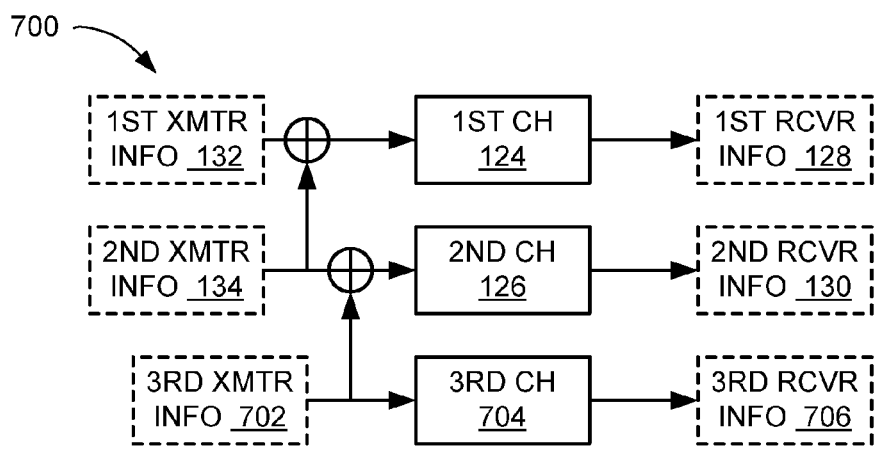
FIG. 7 is a further exemplary block diagram of the communication system.

Referring now to FIG. 7 therein is shown a further exemplary block diagram 700 of the communication system 100 of FIG. 1. The exemplary block diagram 700 can describe the communication system 100 utilizing the compound instances of the transmission channel 122 of FIG. 1 having the channel count 314 of FIG. 3 of three. The exemplary block diagram 700 can be for describing the general approach detailed above.

The further exemplary block diagram 700 can show a third transmitter information 702 representing at least one instance of the any additional transmitter information. A third channel 704 and a third receiver information 706 can similarly represent at least one instance of any additional channels or receiver information as described above.

Figure 8:
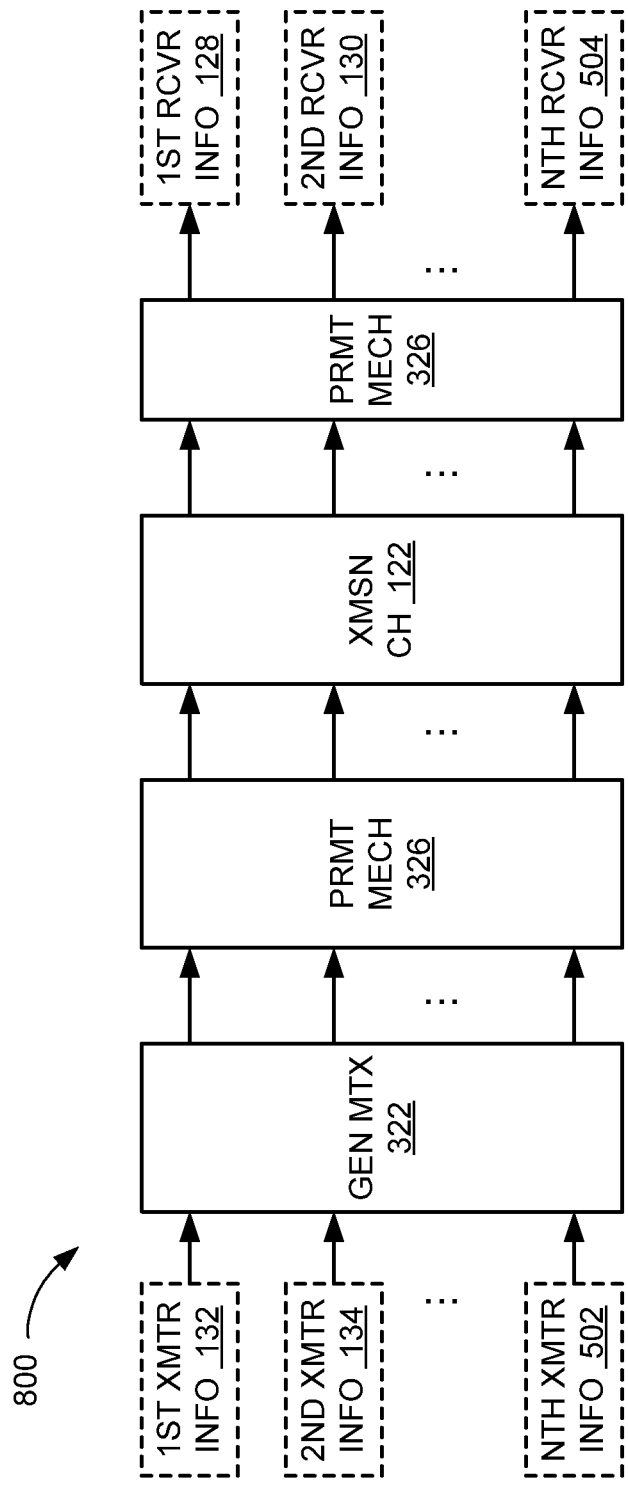
FIG. 8 is a different detailed alternative control flow of the communication system.

Referring now to FIG. 8 therein is shown a different detailed alternative control flow 800 of the communication system 100 of FIG. 1. The different detailed alternative control flow 800 can include the generator matrix 322 or a combination of the initial building block 312 of FIG. 3 and the transformation mechanism 316 of FIG. 3, the combination represented as '$G_0 \, G^{\otimes n} \, G^{\otimes n}$', applied to the further exemplary block diagram 700 of FIG. 7.

The different detailed alternative control flow 800 can be similar to the detailed alternative control flow 500 of FIG. 5 but for describing the general approach with the channel count 314 of FIG. 3 having a value of 3. The different detailed alternative control flow 800 can apply '$G_0 \, G^{\otimes n} \, G^{\otimes n}$' instead of just the transformation mechanism 316 as between FIG. 4 and FIG. 5. The encoder module 302 of FIG. 3, the arrangement module 306 of FIG. 3, the first device 102 of FIG. 1, the second device 106 of FIG. 1, or a combination thereof can determine the channel count 314 of FIG. 3 and process for the detailed alternative control flow 500 or the different detailed alternative control flow 800 accordingly.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization. Another important aspect of an embodiment of the present invention is that it valuably supports and services the historical trend of reducing costs, simplifying systems, and increasing performance.

These and other valuable aspects of an embodiment of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A communication system comprising:
   an antenna configured to receive a receiver signal, the antenna for communicating a transmitter signal corresponding to the receiver signal over transmission channels according to a polar coding scheme;
   a communication unit, coupled to the antenna, configured to process the receiver signal, the receiver signal for representing a coded-message based on an initial building block maximizing a polarization rate, and including:
   an arrangement module configured to generate a sequenced-signal based on the receiver signal according to a permutation mechanism; and
   a decoder module, coupled to the arrangement module, configured to determine a communication content based on the sequenced-signal for communicating the communication content intended by the transmitter signal with a device.

2. The system as claimed in claim 1 wherein the decoder module is a single instance module.

3. The system as claimed in claim 1 wherein the arrangement module is configured to implement the permutation mechanism for mapping a bit channel associated with the polar coding scheme to one of the transmission channels.

4. The system as claimed in claim 1 wherein the communication unit is configured to process the receiver signal for representing the coded-message based on the initial building block and a transformation mechanism according to the polar coding scheme.

5. The system as claimed in claim 1 wherein:
   the antenna is configured to receive the receiver signal including a receiver information and a further receiver information, the receiver information and the further receiver information for representing the receiver signal received through a channel and a further channel;
   the communication unit includes the decoder module configured to implement a successive cancellation mechanism.

6. A communication system comprising:
   a communication unit including:
      an encoder module configured to:
         calculate an initial building block maximizing a polarization rate,
         determine a coded-message based on the initial building block for representing a communication content according to a polar coding scheme,
      a permutation module, coupled to the encoder module, configured to generate a message-channel map for mapping the coded-message to transmission channels; and
   an antenna, coupled to the communication unit, configured to transmit a transmitter signal based on the coded-message according to the message-channel map for communicating the transmitter signal through the transmission channels with a device.

7. The system as claimed in claim 6 wherein the encoder module is configured to determine the coded-message based on a transformation mechanism.

8. The system as claimed in claim 6 wherein:
   the encoder module is configured to:
      determine a channel count for representing instances of the transmission channels including a channel and a further channel;
   the permutation module is configured to:
      determine a transmitter information and a further transmitter information based on the coded-message and the channel count;
   the antenna is configured to transmit the transmitter signal including the transmitter information and the further transmitter information, the transmitter information and the further transmitter information for representing the transmitter signal corresponding to the channel and the further channel.

9. The system as claimed in claim 6 wherein the encoder module is configured to calculate an invertible instance for the initial building block.

10. A method of operation of a communication system comprising:
- receiving a receiver signal with an antenna for communicating a transmitter signal corresponding to the receiver signal over transmission channels according to a polar coding scheme, the receiver signal for representing a coded-message based on an initial building block maximizing a polarization rate;
- generating a sequenced-signal based on the receiver signal according to a permutation mechanism with a communication unit; and
- determining a communication content based on the sequenced-signal for communicating the communication content intended by the transmitter signal with a device.

11. The method as claimed in claim 10 wherein determining the communication content includes determining the communication content with a single instance of module.

12. The method as claimed in claim 10 wherein generating the sequenced-signal includes implementing the permutation mechanism for mapping a bit channel associated with the polar coding scheme to one of the transmission channels.

13. The method as claimed in claim 10 wherein receiving the receiver signal includes receiving the receiver signal for representing the coded-message based on the initial building block and a transformation mechanism according to the polar coding scheme.

14. The method as claimed in claim 10 wherein:
- receiving the receiver signal includes receiving the receiver signal including a receiver information and a further receiver information, the receiver information and the further receiver information for representing the receiver signal received through a channel and a further channel; and
- determining the communication content includes implementing a successive cancellation mechanism.

15. A method of operation of a communication system comprising:
- determining a coded-message with a communication unit for representing a communication content according to a polar coding scheme, including calculating an initial building block maximizing a polarization rate;
- generating a message-channel map for mapping the coded-message to transmission channels; and
- transmitting a transmitter signal with an antenna based on the coded-message according to the message-channel map for communicating the transmitter signal through the transmission channels with a device.

16. The method as claimed in claim 15 wherein determining the coded-message includes determining the coded-message based on a transformation mechanism.

17. The method as claimed in claim 15 further comprising:
- determining a channel count for representing instances of the transmission channels including a channel and a further channel;
- determining a transmitter information and a further transmitter information based on the coded-message and the channel count; and
- wherein:
- transmitting the transmitter signal includes transmitting the transmitter signal including the transmitter information and the further transmitter information, the transmitter information and the further transmitter information for representing the transmitter signal corresponding to the channel and the further channel.

18. The method as claimed in claim 15 wherein determining the coded-message includes calculating an invertible instance for the initial building block.

* * * * *